United States Patent
Willey et al.

(10) Patent No.: US 12,288,581 B2
(45) Date of Patent: Apr. 29, 2025

(54) EFFICIENT AND LOW POWER REFERENCE VOLTAGE MIXING

(71) Applicant: Advanced Micro Devices, Inc., Santa Clara, CA (US)

(72) Inventors: Aaron D Willey, Hayward, CA (US); Karthik Gopalakrishnan, Cupertino, CA (US); Ramon Mangaser, Arlington, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 217 days.

(21) Appl. No.: 17/855,094

(22) Filed: Jun. 30, 2022

(65) Prior Publication Data

US 2023/0290400 A1    Sep. 14, 2023

Related U.S. Application Data (60) Provisional application No. 63/318,211, filed on Mar. 9, 2022.

(51) Int. Cl.
| | |
|---|---|
| *G11C 5/14* | (2006.01) |
| *G06F 13/40* | (2006.01) |
| *G11C 11/4074* | (2006.01) |
| *G11C 11/4076* | (2006.01) |
| *G11C 11/4093* | (2006.01) |
| *G11C 7/22* | (2006.01) |

(52) U.S. Cl.
CPC ...... *G11C 11/4074* (2013.01); *G06F 13/4027* (2013.01); *G11C 11/4076* (2013.01); *G11C 11/4093* (2013.01); *G11C 7/222* (2013.01); *G11C 2207/2254* (2013.01)

(58) Field of Classification Search
CPC ............ G11C 11/4074; G11C 11/4076; G11C 11/4093; G11C 2207/2254; G06F 13/4027
See application file for complete search history.

(56) References Cited

U.S. PATENT DOCUMENTS

| | | | | |
|---|---|---|---|---|
| 8,513,976 | B2* | 8/2013 | Chang | H04L 25/0278 |
| | | | | 326/82 |
| 8,867,595 | B1* | 10/2014 | Luo | G11C 29/022 |
| | | | | 375/225 |
| 10,230,370 | B2 | 3/2019 | Guo et al. | |
| 2010/0327957 | A1* | 12/2010 | Swartz | H04L 25/028 |
| | | | | 327/530 |
| 2012/0057261 | A1* | 3/2012 | Poulton | H04L 25/0272 |
| | | | | 327/87 |
| 2014/0044220 | A1* | 2/2014 | Hollis | G06F 13/00 |
| | | | | 375/317 |
| 2017/0222649 | A1* | 8/2017 | Koo | H03K 19/00361 |
| 2018/0309448 | A1* | 10/2018 | Guo | H04B 15/005 |
| 2023/0046477 | A1* | 2/2023 | Mangaser | G05F 1/46 |

* cited by examiner

*Primary Examiner* — Mushfique Siddique
(74) *Attorney, Agent, or Firm* — Polansky & Associates, P.L.L.C.; Paul J. Polansky (57) ABSTRACT

A data transmission system includes a first integrated circuit. The first integrated circuit includes a first mixing terminal coupled to a first power supply voltage terminal at a point internal to the first integrated circuit, a first return terminal, a first resistor having a first terminal coupled to the first mixing terminal, and a second terminal for providing a first mixed voltage, and a second resistor having a first terminal coupled to the second terminal of the first resistor, and a second terminal coupled to the first return terminal.

15 Claims, 9 Drawing Sheets

EFFICIENT AND LOW POWER REFERENCE VOLTAGE MIXING

This application claims priority to U.S. provisional application No. 63/318,211, filed Mar. 9, 2022, the entire contents of which are herein incorporated by reference.

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. In one example, graphics double data rate (GDDR) memory has pushed the boundaries of data transmission rates to accommodate the high bandwidth needed for graphics applications. For example, a new GDDR standard known as GDDR7 is being developed that supports even higher data rates than existing GDDR and DDR memories.

When operating at speeds as high as several GHz, integrated circuit memories such as GDDR memories require receivers that are sensitive enough to capture the correct logic state of the data when the difference between a logic high state and the logic low state is only a few hundred millivolts (mV). Because of the small voltage swing, transmission and reception of data is susceptible to different environmental factors that can cause data transmission failure. One of those factors is noise that includes not only random energy fluctuations but also electromagnetic interference (EMI) absorbed from the surrounding environment. To reduce the occurrence of reception errors and increase memory operating speed, therefore, it would be useful to reduce the sensitivity of integrated circuits to environmental noise.

One technique that has been proposed for the new GDDR7 standard is known as reference voltage (VREF) mixing. Using VREF mixing, power supply noise from both ends of the transmission line is mixed into a reference voltage that is used in data transmission and reception. However, VREF mixing has not yet been adapted for and integrated into complex, high-speed interfaces like the interfaces proposed for GDDR7 memory.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data transmission system includes a first integrated circuit. The first integrated circuit includes a first mixing terminal coupled to a first power supply voltage terminal at a point internal to the first integrated circuit, a first return terminal, a first resistor having a first terminal coupled to the first mixing terminal, and a second terminal for providing a first mixed voltage, and a second resistor having a first terminal coupled to the second terminal of the first resistor, and a second terminal coupled to the first return terminal.

A data transmission system includes a first integrated circuit and a second integrated circuit. The first integrated circuit includes a first mixing terminal, a reference voltage generator, and a receiver circuit. The first mixing terminal receives a voltage having a noise component of a second power supply voltage of the second integrated circuit. The reference voltage generator receives a first power supply voltage of the first integrated circuit and the voltage and provides a first reference voltage signal in response thereto. The receiver circuit has a first input for receiving an input signal, a second input for receiving the first reference voltage signal, and an output for providing a received signal.

A method for data communication between a first integrated circuit and a second integrated circuit includes receiving a voltage on a mixing terminal of the first integrated circuit containing a noise component of a second power supply voltage of the second integrated circuit. A first reference voltage signal is generated in the first integrated circuit using a first reference voltage generator based on a first power supply voltage of the first integrated circuit and said voltage on said mixing terminal of the first integrated circuit. The first power supply voltage and said first reference voltage signal are used to receive at least one signal at an input terminal of the first integrated circuit.

Figure 1:
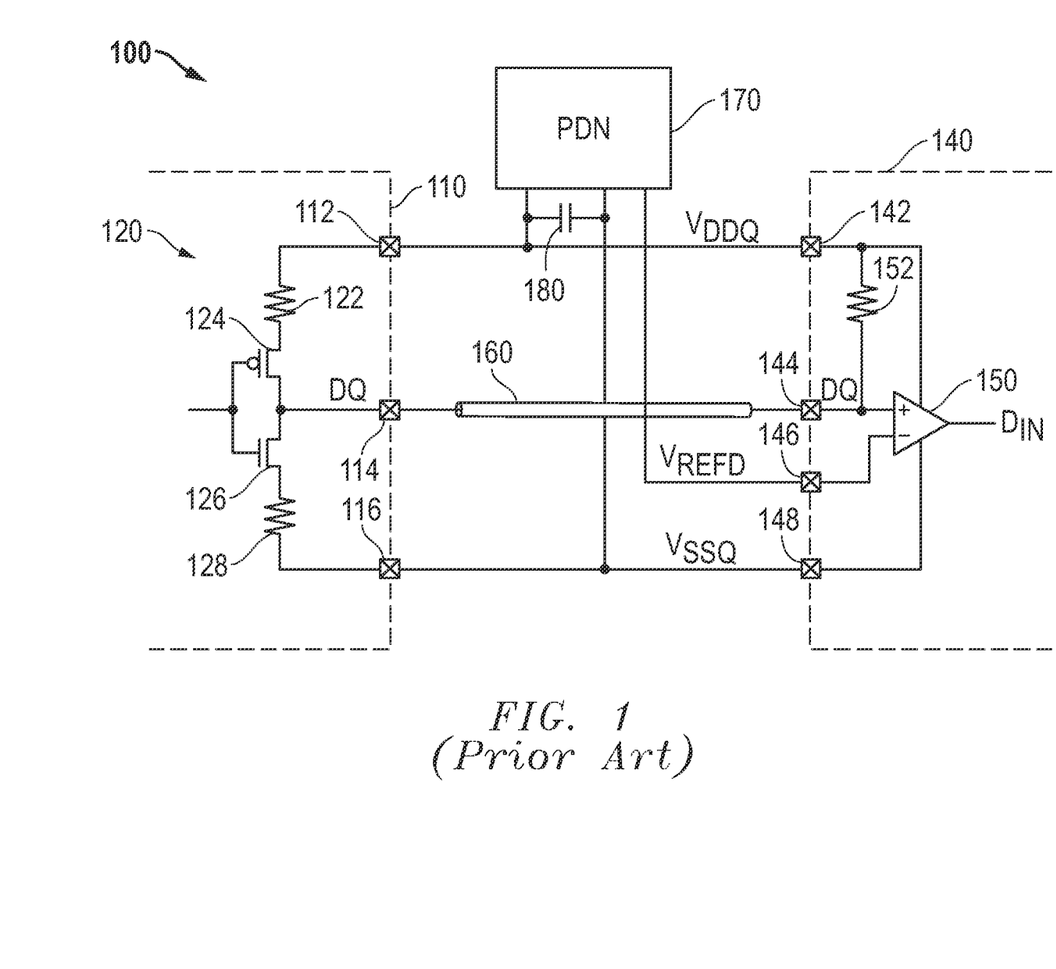
FIG. 1 illustrates in partial block diagram and partial schematic form a data transmission system known in the prior art.

FIG. 1 illustrates in partial block diagram and partial schematic form a data transmission system 100 known in the prior art. Data transmission system 100 includes generally a transmission circuit 110, a reception circuit 140, a transmission line 160, a power distribution network 170 labeled "PDN", and a capacitor 180. Transmission circuit 110 includes a terminal 112 for receiving an input/output (I/O) power supply voltage labeled "$V_{DDQ}$", a terminal 114 for providing a data output signal labeled "DQ", a terminal 116 for receiving an I/O ground voltage labeled "$V_{SSQ}$", and a driver 120. Driver 120 includes a resistor 122, a transistor 124, a transistor 126, and a resistor 128. Resistor 122 has a first terminal connected to terminal 112, and a second terminal. Transistor 124 is a P-channel MOS transistor having a source connected to the second terminal of resistor 122, a gate, and a drain connected to terminal 114. Transistor 126 is an N-channel MOS transistor having a drain connected to the drain of transistor 124, a gate connected to the gate of transistor 124, and a source connected to terminal 116.

Reception circuit 140 includes a terminal 142 for receiving $V_{DDQ}$, a terminal 144 for receiving signal DQ, a terminal 146 for receiving a reference voltage labeled "$V_{REFD}$", a terminal 148 for receiving $V_{SSQ}$, a comparator 150, and a resistor 152. Comparator 150 has a non-inverting input connected to terminal 144, an inverting input connected to terminal 146, an output for providing a data input signal labeled "$D_{IN}$", a positive power supply voltage terminal connected to terminal 142, and a negative power supply terminal connected to terminal 146. Resistor 152 has a first terminal connected to terminal 142, and a second terminal connected to terminal 144.

Transmission line 160 has a first end connected to terminal 114 of transmission circuit 110, and a second end connected to terminal 144 of reception circuit 140.

Power distribution network 170 has an output for providing $V_{DDQ}$, an output for providing I/O ground, and an output for providing reference voltage $V_{REFD}$. Capacitor 180 has a first terminal for receiving $V_{DDQ}$, and a second terminal for receiving $V_{SSQ}$.

In one example, reception circuit 140 is a double data rate (DDR) memory chip and transmission circuit 110 is a system-on-chip (SOC) that has an interface to the memory chip over conductors on a printed circuit board. Driver 120 in transmission circuit 110 is a push-pull driver that has a characteristic impedance set by resistor 122 when driver 120 drives a high voltage and by resistor 128 when driver 120 drives a low voltage. Reception circuit 140 senses the voltage at the second end of transmission line 160 using comparator 150 and resistor 152, which serves as a termination to transmission line 160. Comparator 150 compares the voltage on terminal 144 to reference voltage $V_{REFD}$ received on terminal 146 and provides signal $D_{IN}$ in response. Reference voltage $V_{REFD}$ is approximately midway between $V_{DDQ}$ and $V_{SSQ}$.

Power distribution network 170 receives power from a voltage source such as a battery or AC mains through a switch mode power supply that provides power supply voltage $V_{DDQ}$ at a desired level with respect to $V_{SSQ}$. It also provides $V_{REFD}$ at approximately midway between $V_{DDQ}$ and $V_{SSQ}$. Capacitor 180 operates as a power supply decoupling capacitor and provides noise filtering and decoupling between $V_{DDQ}$ and $V_{SSQ}$.

Data transmission and reception operations are susceptible to noise injected into the power supply distribution network. Power supply voltage $V_{DDQ}$ at terminal 112 is different than $V_{DDQ}$ at terminal 142 due to the impedance of the conductor that distributes $V_{DDQ}$. Likewise, ground voltage $V_{SSQ}$ at terminal 116 is different than $V_{SSQ}$ at terminal 148 due to the impedance of the conductor that distributes $V_{SSQ}$. In certain environments, noise can be injected into the power supply distribution network that is so significant that reception circuit can provide signal $D_{IN}$ in the wrong state.

Figure 2:
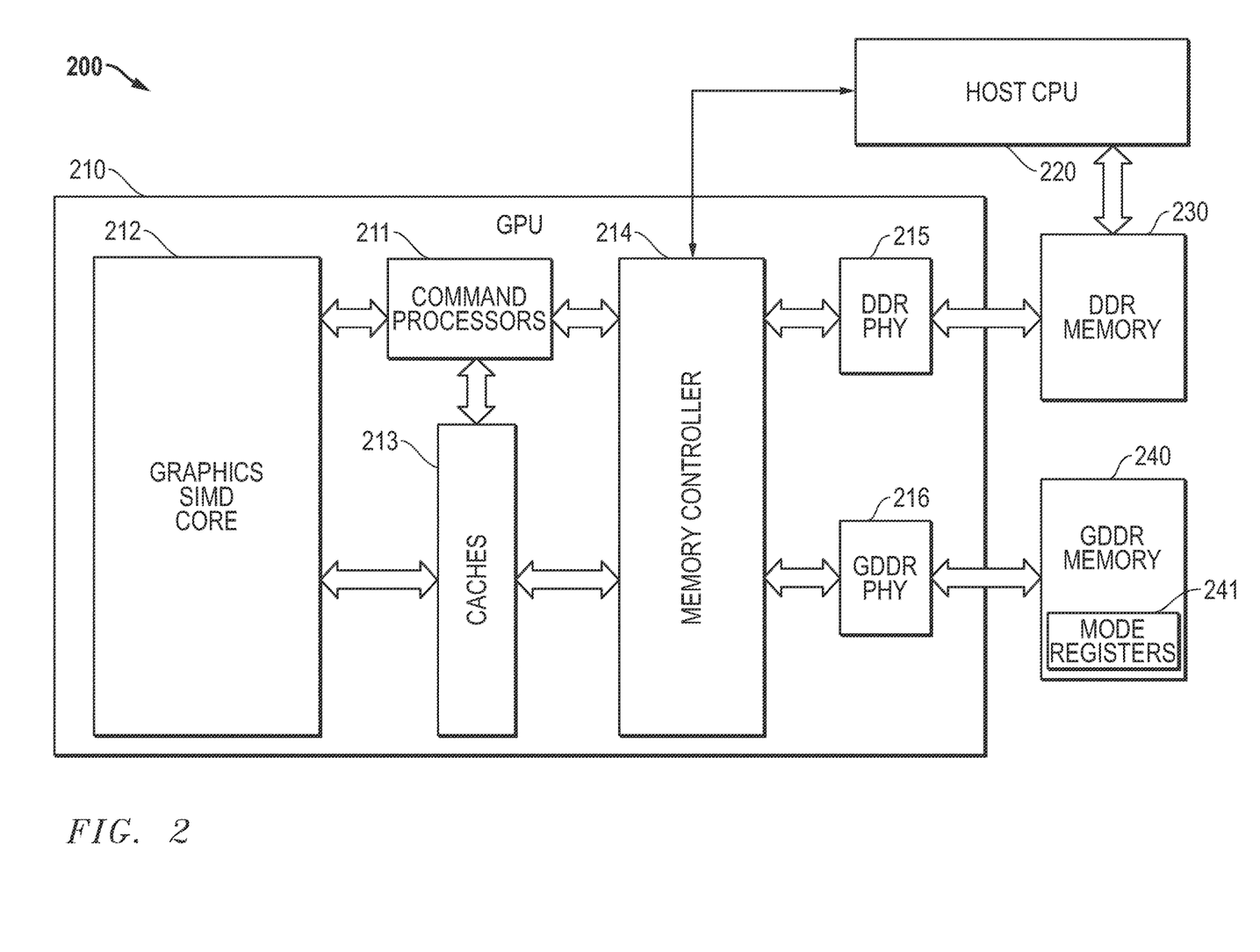
FIG. 2 illustrates in block diagram form a data processing system requiring high-speed data transmission according to some embodiments.

FIG. 2 illustrates in block diagram form a data processing system 200 requiring high-speed data transmission according to some embodiments. Data processing system 200 includes generally a data processor in the form of a graphics processing unit (GPU) 210, a host central processing unit (CPU) 220, a double data rate (DDR) memory 230, and a graphics DDR (GDDR) memory 240.

GPU 210 is a discrete graphics processor that has extremely high performance for optimized graphics processing, rendering, and display, but requires a high memory bandwidth for performing these tasks. GPU 210 includes generally a set of command processors 211, a graphics single instruction, multiple data (SIMD) core 212, a set of caches 213, a memory controller 214, a DDR physical interface circuit (DDR PHY) 215, and a GDDR PHY 216.

Command processors 211 are used to interpret high-level graphics instructions such as those specified in the OpenGL programming language. Command processors 211 have a bidirectional connection to memory controller 214 for receiving high-level graphics instructions such as OpenGL instructions, a bidirectional connection to caches 213, and a bidirectional connection to graphics SIMD core 212. In response to receiving the high-level instructions, command processors 211 issue low-level instructions for rendering, geometric processing, shading, and rasterizing of data, such as frame data, using caches 213 as temporary storage. In response to the graphics instructions, graphics SIMD core 212 performs low-level instructions on a large data set in a massively parallel fashion. Command processors 211 and caches 213 are used for temporary storage of input data and output (e.g., rendered and rasterized) data. Caches 213 also have a bidirectional connection to graphics SIMD core 212, and a bidirectional connection to memory controller 214.

Memory controller 214 has a first upstream port connected to command processors 211, a second upstream port connected to caches 213, a first downstream bidirectional port to DDR PHY 215, and a second downstream bidirectional port to GDDR PHY 216. As used herein, "upstream" ports are on a side of a circuit toward a data processor and away from a memory, and "downstream" ports are in a direction away from the data processor and toward a memory. Memory controller 214 controls the timing and sequencing of data transfers to and from DDR memory 230 and GDDR memory 240. DDR and GDDR memory have asymmetric accesses, that is, accesses to open pages in the memory are faster than accesses to closed pages. Memory controller 214 stores memory access commands and processes them out-of-order for efficiency by, e.g., favoring accesses to open pages, while observing certain quality-of-service objectives.

DDR PHY 215 has an upstream port connected to the first downstream port of memory controller 214, and a downstream port bidirectionally connected to DDR memory 230. DDR PHY 217 meets all specified timing parameters of the version of DDR memory 230, such as DDR version five (DDR5), and performs timing calibration operations at the direction of memory controller 214. Likewise, GDDR PHY 218 has an upstream port connected to the second downstream port of memory controller 214, and a downstream port bidirectionally connected to GDDR memory 240. GDDR PHY 216 meets all specified timing parameters of the version of GDDR memory 240, such as GDDR version seven (GDDR7), and performs timing calibration operations at the direction of memory controller 214.

GDDR memory 240 has a set of mode registers 241 that allow configuration of various parameters associated with the operation of GDDR memory 240. Notably, they include parameters related to how VREF mixing is performed, and will be described in greater detail below.

Figure 3:
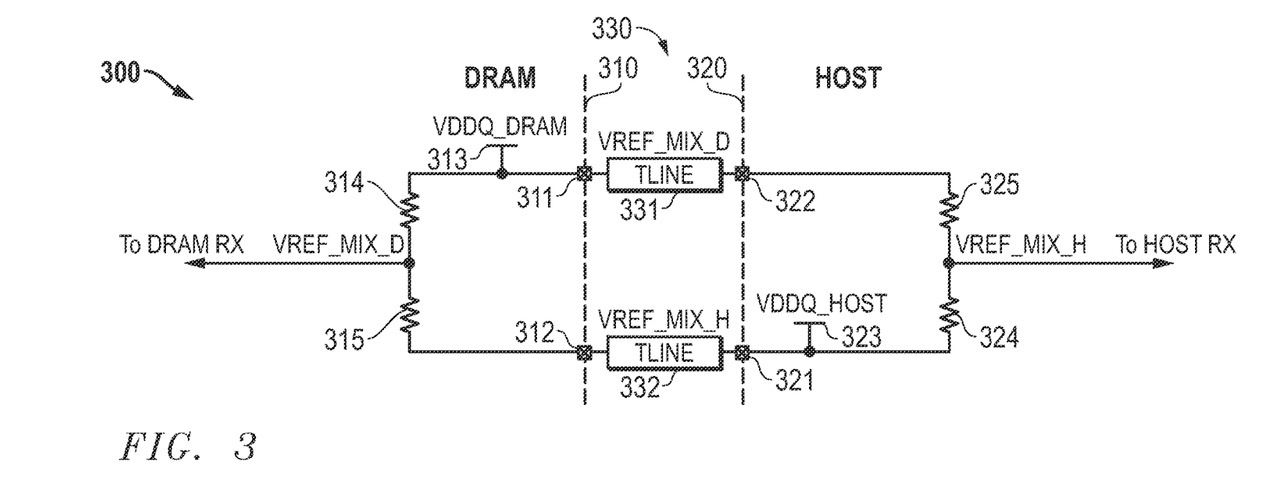
FIG. 3 illustrates in partial block diagram and partial schematic form a portion of a data transmission system with dual read and write power supply noise mixing according to some embodiments.

FIG. 3 illustrates in partial block diagram and partial schematic form a portion of a data transmission system 300 with dual read and write power supply noise mixing according to some embodiments. Data transmission system 300 generally includes a DRAM 310, a host 320, and transmission media 330.

DRAM 310 is a monolithic semiconductor chip that includes a mixing terminal 311, a return terminal 312, a power supply voltage terminal 313, a resistor 314, and a resistor 315. Mixing terminal 311 is connected to power supply voltage terminal 313, which conducts a power supply voltage labelled "VDDQ_DRAM", at a point inside DRAM 310. Mixing terminal 311 and return terminal 312 are connection points on the monolithic semiconductor chip such as a bonding pad or through-silicon via (TSV) pad. Resistor 314 has a first terminal connected to mixing terminal 311, and a second terminal for providing a voltage labelled "VREF_MIX_D". Resistor 315 has a first terminal connected to the second terminal of resistor 314, and a second terminal connected to return terminal 312.

Host 320 is a monolithic semiconductor chip that includes a mixing terminal 321, a return terminal 322, a power supply voltage terminal 323, a resistor 324, and a resistor 325. Mixing terminal 321 is connected to power supply voltage terminal 323, which conducts a power supply voltage labelled "VDDQ_HOST", at a point inside host 320. Resistor 324 has a first terminal connected to mixing terminal 321, and a second terminal for providing a voltage labelled "VREF_MIX_H". Resistor 325 has a first terminal connected to the second terminal of resistor 324, and a second terminal connected to return terminal 322.

Transmission media 330 includes a transmission line 331 and a transmission line 332, each labelled "TLINE". Transmission line 331 has a first end connected to mixing terminal 311 of DRAM 310, and a second end connected to return terminal 322 of host 320. Transmission line 332 similarly has a first end connected to mixing terminal 321 of host 320, and a second end connected to return terminal 312 of DRAM 310. In various embodiments, each of transmission line 331 and transmission line 332 can be a chip-to-chip intermetallic, a through-silicon via (TSV), a thin filament wire used in a wire bonding process, a trace on a printed circuit board, or some combination of these types of interconnects.

As shown in FIG. 3, each of DRAM 310 and host processor 320 has both a mixing terminal, to which its respective internal power supply voltage terminal is connected, and a return terminal, by which it receives the opposite end power supply voltage over a corresponding transmission line. In DRAM 310, resistors 314 and 315 operate as a voltage divider to form VREF_MIX_D as an average of the voltage on mixing terminal 311 and the voltage on return terminal 312. DRAM 310 uses VREF_MIX_D in receiver circuits that receive signals sent from host 320. Similarly in host 320, resistors 324 and 325 operate as a voltage divider to form VREF_MIX_H as an average of the voltage on mixing terminal 321 and the voltage on return terminal 322. Host 320 uses VREF_MIX_H in receiver circuits that receive signals sent from DRAM 310.

By mixing the power supply voltages from both the source chip and the sink chip, VREF_MIX_D and VREF_MIX_H contain components of power supply noise from both chips. These voltages provide more robust data reception. For example, if DRAM 310 transmits data to host 320 using PAM-4 signaling, the data eye for each of the four possible signal levels will be higher and wider using VREF_MIX_H than by using VDD_HOST alone because it mixes the uncorrelated noise from each of the two sources in VREF_MIX_H. Data transmission system 300 uses two terminals on each of DRAM 310 and host 320 to form VREF_MIX_D and VREF_MIX_H, respectively, for use in signal reception. It is suitable for power supply voltage noise mixing of power supply voltages for input/output signals, such as DQ (data input/output) signals, and can also be used for unidirectional signal reception of signals operating with the same power supply voltage, such as clock receivers.

Figure 4:
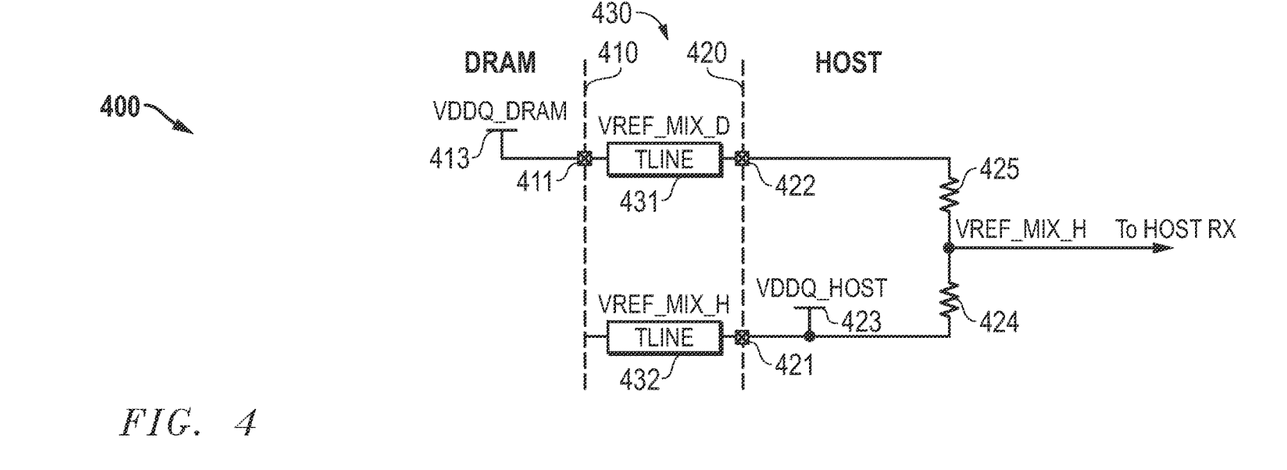
FIG. 4 illustrates in partial block diagram and partial schematic form a portion of another data transmission system with dual read-only power supply noise mixing according to some embodiments.

FIG. 4 illustrates in partial block diagram and partial schematic form a portion of another data transmission system 400 with dual read-only power supply noise mixing according to some embodiments. Data transmission system 400 is suitable for a unidirectional signal sent from a DRAM 410 to a host 420. Data transmission system 400 generally includes DRAM 410, host 420, and transmission media 430.

DRAM 410 is a monolithic semiconductor chip that includes a mixing terminal 411. Mixing terminal 411 is connected to power supply voltage terminal 313, which conducts power supply voltage VDDQ_DRAM, at a point inside DRAM 410.

Host 420 is a monolithic semiconductor chip that includes a mixing terminal 421, a return terminal 422, a power supply voltage terminal 423, a resistor 424, and a resistor 425. Mixing terminal 421 is connected to power supply voltage terminal 423, which conducts power supply voltage VDDQ_HOST at a point inside host 420. Resistor 424 has a first terminal connected to mixing terminal 421, and a second terminal for providing VREF_MIX_H to receive circuitry inside host 420. Resistor 425 has a first terminal connected to the second terminal of resistor 424, and a second terminal connected to return terminal 422.

Transmission media 430 includes a transmission line 431 and a transmission line 432. Transmission line 431 has a first end connected to mixing terminal 411 of DRAM 410, and a second end connected to return terminal 422 of host 420. Transmission line 332 has a first end connected to mixing terminal 421 of host 420, and a second end. In various embodiments, each of transmission line 431 and transmission line 432 can be a chip-to-chip intermetallic, a through-silicon via (TSV), a thin filament wire used in a wire bonding process, a trace on a printed circuit board, or some combination of these types of interconnects.

As shown in FIG. 4, host processor 420 has both a mixing terminal 421, to which its respective internal power supply voltage terminal is connected, and a return terminal 422, by which is receives the opposite power supply voltage over a corresponding transmission line. DRAM 410, however, does not have a return terminal because there is no corresponding receiver and hence no need for it to mix power supply noise from the opposite end of the transmission line. In host 420, resistors 424 and 425 operate as a voltage divider to form VREF_MIX_H as a mix (such as an average) of the voltage on mixing terminal 421 and the voltage on return terminal 422, and host 420 uses VREF_MIX_H in receiver circuits that receive signals sent from DRAM 410.

Host 420 obtains VREF_MIX_H by mixing power supply voltages from both DRAM 410 and host 420, and VREF_MIX_H contains a mix (such as an average) of power supply noise from both chips and these voltages provide more robust data reception inside host 420. For example, when DRAM 410 transmits a signal to host 420 using PAM-4 signaling, the data eye for each of the four possible signal levels will be higher and wider using VREF_MIX_H than by using VDD_HOST alone because it averages the uncorrelated noise from each of the two sources in VREF_MIX_H. Data transmission system 400 is suitable for output-only signals on one chip and input-only signals in the other chip. It uses two terminals on host 420 and two transmission lines, but only one terminal on DRAM 410. The extra transmission line 432 and the extra mixing terminal 421 allow similar noise on the host side to be balanced, but the transmission line 432 could optionally be removed if not used by DRAM 410. Data transmission system 400 is suitable for transmission of unidirectional signals, such as command and address signals and clock signals that are always output by the host and input by the DRAM, and EDC signals that are always output by the DRAM and input by the host.

Figure 5:
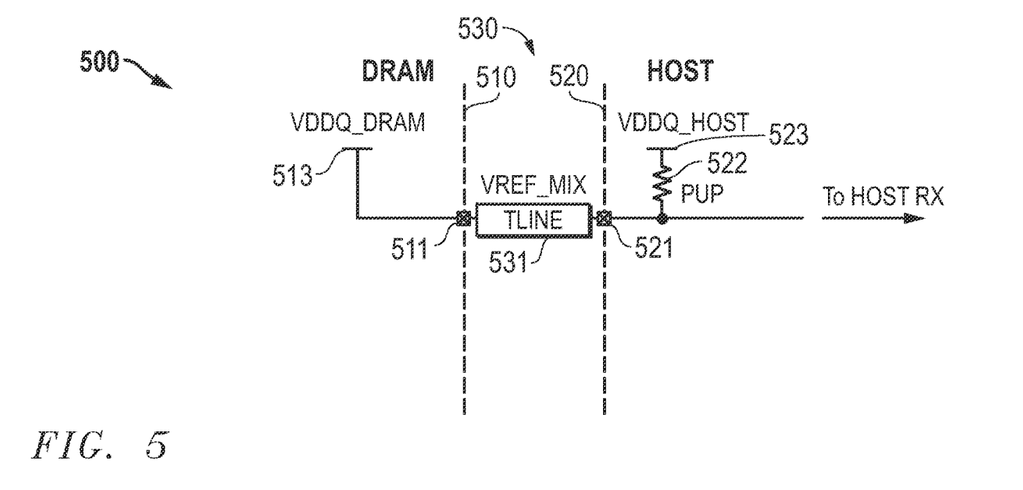
FIG. 5 illustrates in partial block diagram and partial schematic form a portion of yet another data transmission system with single-ended read only power supply noise mixing according to some embodiments.

FIG. 5 illustrates in partial block diagram and partial schematic form a portion of yet another data transmission system 500 with single-ended read only power supply noise mixing according to some embodiments. Data transmission system 500 is suitable for a unidirectional signal sent from a DRAM 510 to a host 520. Data transmission system 500 generally includes DRAM 510, host 520, and transmission media 530. DRAM 510 includes a terminal 511 that is internally connected to a power supply voltage terminal 513 conducting signal VDDQ_DRAM. Host 520 includes a terminal 521 that is internally connected through a resistor 522 to a power supply voltage terminal 523 conducting power supply voltage VDDQ_HOST. Transmission media 530 includes a transmission line 531 having a first end connected to terminal 511 on DRAM 510, and a second end connected to terminal 521 on host 520. Host 520 forms mixed power supply voltage VDD_MIX_H on terminal 521 and provides it to internal receive circuits in host 520. The power supply noise from both DRAM 510 and host 520 is mixed using a resistor 522 whose resistance is ratioed to the characteristic resistance of transmission line 531. For example, the resistance can equal the characteristic resistance of transmission line 531 to provide signal averaging. In this way, data transmission system 500 is suitable for transmission of unidirectional signals, such as command and address signals and clock signals that are always output by the host and input by the DRAM, and EDC signals that are always output by the DRAM and input by the host, using a simpler single-ended circuit than that shown in FIG. 4.

Figure 6:
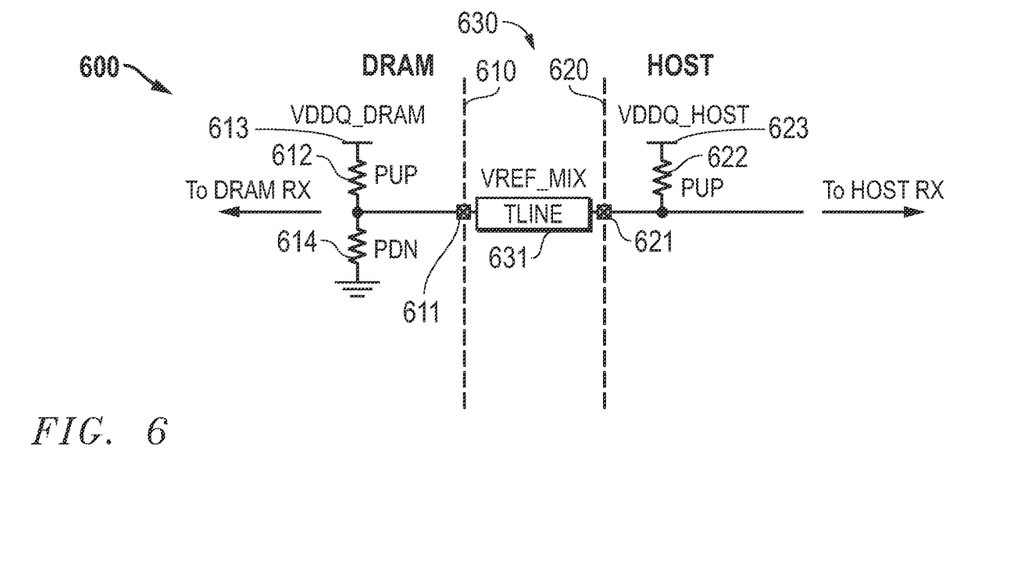
FIG. 6 illustrates in partial block diagram and partial schematic form a portion of still another data transmission system with single-ended read and write power supply noise mixing according to some embodiments.

FIG. 6 illustrates in partial block diagram and partial schematic form a portion of still another data transmission system 600 with single-ended read and write power supply noise mixing according to some embodiments. Data transmission system 600 is suitable for bidirectional signals sent between a DRAM 610 and a host 620. Data transmission system 600 generally includes DRAM 610, host 620, and transmission medium 530. DRAM 610 includes a terminal 611 that is internally connected through a resistor 612 to a power supply voltage terminal 613 conducting signal VDDQ_DRAM and through a resistor 614 to ground. Host 620 includes a terminal 621 that is internally connected through a resistor 622 to a power supply voltage terminal 623 conducting power supply voltage VDDQ_HOST. Transmission medium 630 is formed by a transmission line 631 having a first end connected to terminal 611 on DRAM 610, and a second end connected to terminal 621 on host 620. DRAM 610 and host 620 collectively form internal reference voltages VREF_MIX_D and VREF_MIX_H, respectively, that include noise components mixed from both VDDQ_DRAM and VDDQ_HOST. However, these reference voltages are not equal to the nominal power supply voltage of the system, but rather to different intermediate voltages.

VREF_MIX_D is equal to the nominal power supply voltage divided by the ratio of the pullup and the pulldown resistive components. The pullup component is equal to the parallel combination of the resistor 612 and the series resistance of transmission line 631 and the resistance of resistor 622. The end-to-end resistance of transmission line 631 will generally be in the range of 50 ohms to about 300 ohms. If the resistances of resistors 612, 622, and 614 are much larger, then the resistance of transmission line 631 can be neglected. Moreover, if the resistances of resistors 612 and 622 are approximately equal and approximately twice the resistance of resistor 614, then VREF_MIX_D and VREF_MIX_H can be set to about one-half of the nominal power supply voltage. Thus, both VREF_MIX_D and VREF_MIX_H can be set to about mid-supply and can contain noise components mixed from both VDDQ_DRAM and VDDQ_HOST. Data transmission system 600 requires only one additional terminal on each of DRAM 610 and host 620, and can use either precision resistors or resistors that can be calibrated to match each other.

Exemplary Implementations in GDDR Systems

Figure 7:
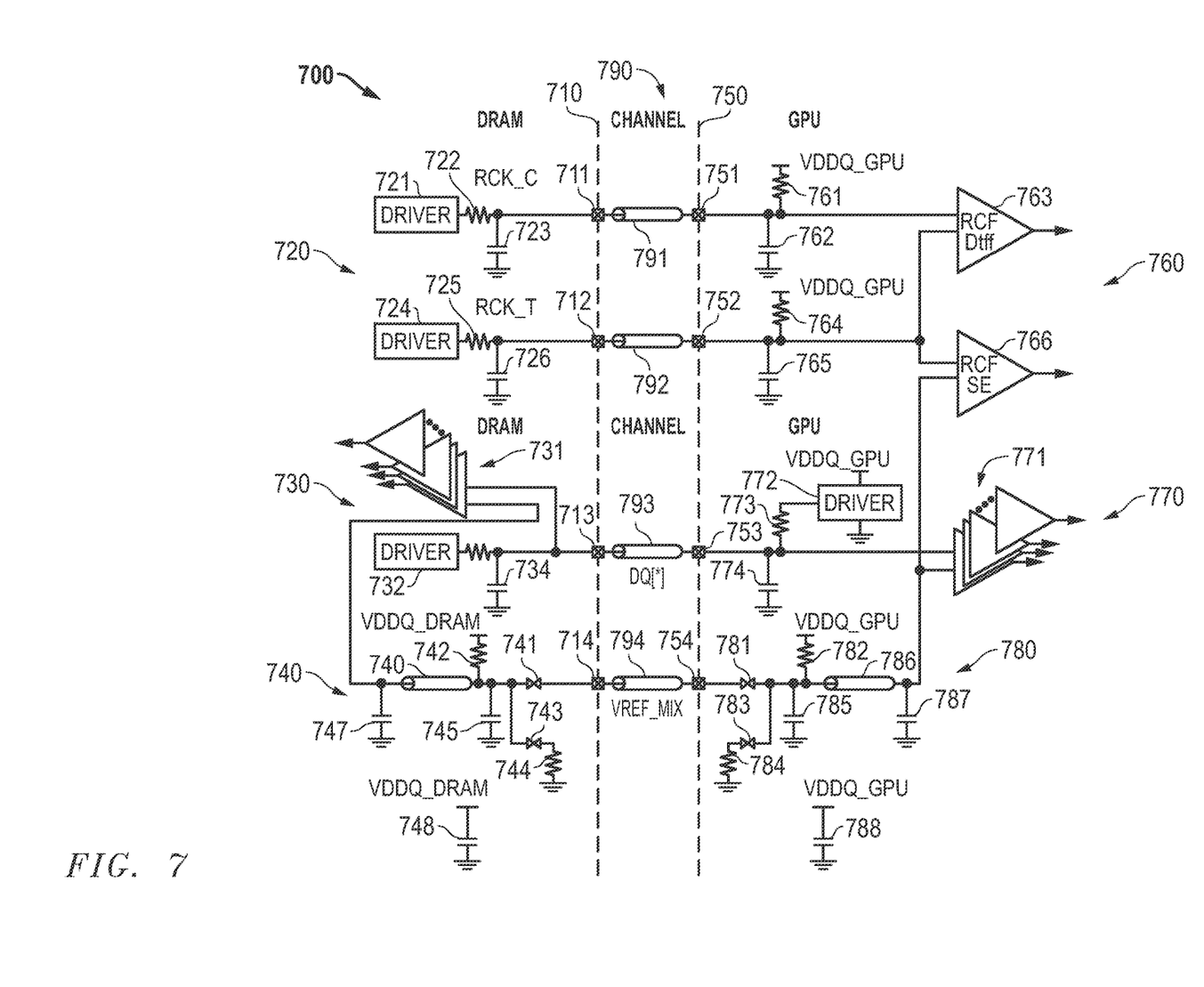
FIG. 7 illustrates in partial block diagram and partial schematic form a GDDR PHY-DRAM link useful in the data processing system of FIG. 2 with power supply noise mixing according to some embodiments.

FIG. 7 illustrates in partial block diagram and partial schematic form a GDDR PHY-DRAM link 700 useful in data processing system 200 of FIG. 2 with power supply noise mixing according to some embodiments. GDDR PHY-DRAM link 700 includes generally a DRAM 710, a GPU 750, and transmission media 790.

DRAM 710 includes a terminal 711 for providing a complement read clock signal labelled "RCK_C", a terminal 712 for providing a true read clock signal labelled "RCK_T", a terminal 713 for conducting an exemplary data input/output signal labelled "DQ[*]", a terminal 714 for conducting VREF_MIX, a set of clock drivers 720, a data input/output circuit 730, and a DRAM VREF generator 740.

Clock drivers 720 include a complement read clock driver circuit 721, a resistor 722, a capacitor 723, a true read clock driver circuit 724, a resistor 725, a capacitor 726. Complement read clock driver circuit 721 has an output for providing a complement component of the RCK signal at signal levels referenced to VDDQ_DRAM and ground. Resistor 722 has a first terminal connected to the output of complement read clock driver circuit 721, and a second terminal connected to terminal 711. Capacitor 723 has a first terminal connected to the second terminal of resistor 722, and a second terminal connected to ground. True read clock driver circuit 724 has an output for providing a true component of the RCK signal at signal levels referenced to VDDQ_DRAM and ground. Resistor 725 has a first terminal connected to the output of true read clock driver circuit 724, and a second terminal connected to terminal 712. Capacitor 726 has a first terminal connected to the second terminal of resistor 725, and a second terminal connected to ground.

Data input/output circuit 730 includes a set of DQ receivers 731, a data signal driver circuit 732, a resistor 733, and a capacitor 734. In the exemplary embodiment shown in FIG. 7, DQ receivers 731 include a set of slicers capable of receiving a multiple-level pulse amplitude modulation (PAM) signal, in which the number of levels is greater than two. FIG. 7 shows the example of PAM-4 signaling using four slicers, but in other embodiments, the DQ receivers could include three receivers for PAM-3 signaling, or one receiver for conventional binary (NRZ) signaling. Moreover FIG. 7 shows DQ receivers for a single data lane. In an exemplary PAM-4 signaling scheme, each channel includes eight data bits, one data mask (DM) bit, and one ECC bit (DQE) for a total of 10 bits transferred on each edge of the read clock during a read burst. In PAM-3 signaling, however, DQ receivers 731 would use a potentially different number of DQ receivers to receive a symbol per edge of the read clock that, taking into account multiple symbols times, would be decoded into data of a power-of-two size. For NRZ signaling, DQ receivers 731 would include one receiver per data bit. Each of the slicers has a positive input connected to terminal 713, a negative input for receiving a mixed reference voltage, and an output for providing a sliced signal level. Driver 732 has an output for providing a respective DQ signal at signal levels referenced to VDDQ_DRAM and ground. For example, if GDDR PHY-DRAM link 700 implements PAM-4 signaling, it would provide a signal having one of four levels. Resistor 733 has a first terminal connected to the output of data signal driver circuit 732, and a second terminal connected to terminal 713. Capacitor 734 has a first terminal connected to the second terminal of resistor 733, and a second terminal connected to ground.

DRAM VREF generator 740 includes an analog switch 741, a resistor 742, an analog switch 743, a resistor 744, a capacitor 745, an intra-byte distribution conductor 746, a capacitor 747, and a capacitor 748. Analog switch 741 has a first terminal connected to terminal 714, and a second terminal. Resistor 742 has a first terminal connected to VDDQ_DRAM, and a second terminal connected to the second terminal of analog switch 741. Analog switch 743 has a first terminal connected to the second terminals of analog switch 741 and resistor 742, and a second terminal. Resistor 744 has a first terminal connected to the second terminal of analog switch 743, and a second terminal connected to ground. Capacitor 745 has a first terminal connected to the second terminals of analog switch 741 and resistor 742, and a second terminal connected to ground. Intra-byte distribution conductor 746 has a first end connected to the second terminals of analog switch 741 and resistor 742 and the first terminal of capacitor 745, and a second end connected to the negative input of the slicers of each of DQ receivers 731. Capacitor 747 has a first terminal connected to the second end of intra-byte distribution conductor 746, and a second terminal connected to ground. Capacitor 748 has a first terminal connected to VDDQ_DRAM, and a second terminal connected to ground, and operates as a decoupling capacitor for noise on the VDDQ_DRAM supply.

GPU 750 includes generally a terminal 751 for receiving the RCK_C signal, a terminal 752 for receiving the RCK_T signal, a terminal 753 for conducting exemplary data signal DQ[*], a terminal 754 for conducting VREF_MIX, a read clock circuit 760, a data input/output circuit 770, and a GPU VREF generator 780.

Read clock circuit 760 includes a resistor 761, a capacitor 762, a receiver 763, a resistor 764, a capacitor 765, a receiver 766. Resistor 761 has a first terminal connected to VDDIO_GPU, and a second terminal connected to terminal 751. Capacitor 762 has a first terminal connected to terminal 751, and a send terminal connected to ground. Receiver 763 has a negative terminal connected to terminal 751, a positive terminal connected to terminal 752, and an output for providing a differentially-generated read clock signal labeled "RCK_DIFF". Resistor 764 has a first terminal connected to VDDIO_GPU, and a second terminal connected to terminal 752. Capacitor 765 has a first terminal connected to terminal 752, and a send terminal connected to ground. Receiver 766 has a positive terminal connected to terminal 752, a negative terminal, and an output for providing a single-ended clock signal labeled "RCK_SE".

Data input/output circuit 770 includes a set of DQ receivers 771, a data signal driver circuit 772, a resistor 773, and a capacitor 774. As in DQ receivers 731 on the DRAM side, DQ receivers 771 include a set of slicers capable of receiving a multiple-level pulse amplitude modulation (PAM) system, in which the number of levels is greater than two. FIG. 7 shows the example of PAM-4 signaling using four slicers, but in other embodiments, the DQ receivers could include three receivers for PAM-3 signaling, or one receiver for conventional binary (NRZ) signaling. Moreover FIG. 7 shows DQ receivers for a single data lane. In an exemplary PAM-4 signaling scheme, each channel includes eight data bits, one data mask (DM) bit, and one ECC bit (DQE) for a total of 10 bits transferred on each edge of the read clock during a read burst. In PAM-3 signaling, however, DQ receivers 731 would use a potentially different number of DQ receivers to receive a symbol per edge of the read clock that, taking into account multiple symbols times, would be decoded into data of a power-of-two size. For NRZ signaling, DQ receivers 731 would include one receiver per data bit. Each of the slicers has a positive input connected to terminal 713, a negative input for receiving a mixed reference voltage, and an output for providing a sliced signal level. Driver 772 has an output for providing a respective DQ signal at signal levels referenced to VDDIO_GPU and ground. For example, if GDDR PHY-DRAM link 700 implements PAM-4 signaling, it would provide a signal having one of four levels. Resistor 773 has a first terminal connected to the output of data signal driver circuit 772, and a second terminal connected to terminal 753. Capacitor 774 has a first terminal connected to the second terminal of resistor 773, and a second terminal connected to ground.

GPU VREF generator 780 includes an analog switch 781, a resistor 782, an analog switch 783, a resistor 784, a capacitor 785, an intra-byte distribution conductor 786, a capacitor 787, and a capacitor 788. Analog switch 781 has a first terminal connected to terminal 754, and a second terminal. Resistor 782 has a first terminal connected to VDDIO_GPU, and a second terminal connected to the second terminal of analog switch 781. Analog switch 783 has a first terminal connected to the second terminals of analog switch 781 and resistor 782, and a second terminal. Resistor 784 has a first terminal connected to the second terminal of analog switch 783, and a second terminal connected to ground. Capacitor 785 has a first terminal connected to the second terminals of analog switch 781 and resistor 782, and a second terminal connected to ground. Intra-byte distribution conductor 786 has a first end connected to the second terminals of analog switch 781 and resistor 782 and the first terminal of capacitor 785, and a second end connected to the negative inputs of the slicers of each of DQ receivers 771. Capacitor 787 has a first terminal connected to the second end of intra-byte distribution conductor 746, and a second terminal connected to ground.

Capacitor 748 has a first terminal connected to VDDIO_GPU, and a second terminal connected to ground, and operates as a decoupling capacitor for noise on the VDDIO_GPU supply.

Transmission media 790 includes a set of transmission lines 791-794. Transmission line 791 has a first end connected to terminal 711 of DRAM 710, and a second end connected to terminal 751 of GPU 750. Transmission line 792 has a first end connected to terminal 712 of DRAM 710, and a second end connected to terminal 752 of GPU 750. Transmission line 793 has a first end connected to terminal 713 of DRAM 710, and a second end connected to terminal 753 of GPU 750. Transmission line 794 has a first end connected to terminal 714 of DRAM 710, and a second end connected to terminal 754 of GPU 750. In various embodiments, each of transmission lines 791-794 can be a chip-to-chip intermetallic, a through-silicon via (TSV), a thin filament wire used in a wire bonding process, a trace on a printed circuit board, or some combination of these types of interconnects.

DRAM 710 and GPU 750 are connected to form GDDR PHY-DRAM link 700, and both DRAM 710 and GPU 750 support various programmable configurations of VREF mixing according to the description above. In particular, DRAM 710 has two analog switches 741 and 743 that can be activated either statically or dynamically according to the selected mode of VREF mixing. GPU 750 likewise has two analog switches 781 and 783 that likewise can be activated either statically or dynamically according to the selected mode of VREF mixing.

When analog switches 741 and 781 are active and analog switches 743 and 783 are non-conductive, the configuration matches that of data transmission system 500 of FIG. 5, in which VREF_MIX is used in the GPU receiver but not in the DRAM receiver. An example of a configuration in which this would be useful is the RCK_T is used as a single-ended clock.

When analog switches 741 and 743 are both active in DRAM 710, but analog switch 781 is active while analog switch 783 is non-conductive, the configuration matches that of data transmission system 500 of FIG. 6, in which VREF_MIX is used in the GPU receiver but not in the DRAM receiver. An example of a configuration in which this would be useful is RCK_T when it is used as a single-ended clock.

These various options can be implemented in a GDDR memory using bits assigned to mode registers. It would be expected that all vendors would support configurable termination for any dedicated VREF_MIX pin, while it would be optional for DRAM vendors to support actual VREF mixing in their PHY circuits for write cycles, and that the VREF mixing would support configurable on-die termination (ODT).

For example, these various options can be implemented in a GDDR memory using bits assigned to mode registers. In one embodiment, a mode register designated the "VREF_MIX_EN_INFO" mode register would allow the host to readout current DRAM VREFMIX pad configurations. In this register, a one-bit field having a value of 0 would indicate a fixed mode, in which VREF_MIX is shorted to VDDQ on the DRAM die close to the DQ byte group, allowing the host to leverage VREF_MIX for read operations. A value of 1 for this one-bit mode register would indicate on-die termination that is programmable based on another register called the "VREF_MIX_ODT" register. The VREF_MIX_ODT register would contain a 2-bit field in which a value of 00 indicates that VREF mixing is disabled (off); a value of 01 indicates the use of a 40Ω pullup to VDDQ_DRAM; an optional value of 10 selects a 40Ω pullup value with a 60Ω pulldown value; and an optional value of 11 selects a 40Ω pullup value and a 120Ω pulldown value. It should be apparent that while these values are useful values, other values and combinations are possible.

Figure 8:
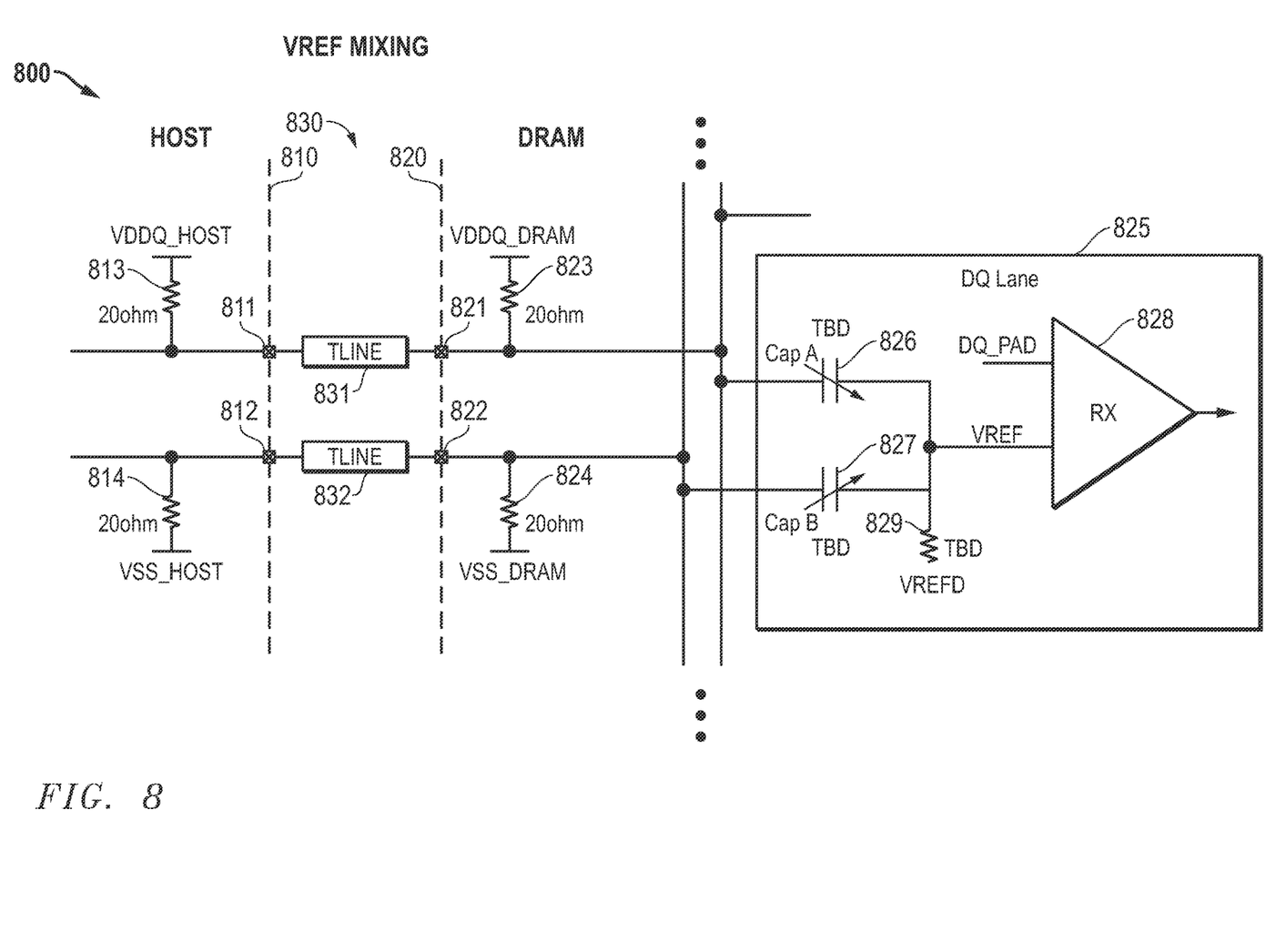
FIG. 8 illustrates in partial block diagram and partial schematic form another GDDR PHY-DRAM link useful in the data processing system of FIG. 2 with power supply noise mixing according to some embodiments.

FIG. 8 illustrates in partial block diagram and partial schematic form another GDDR PHY-DRAM link 800 useful in the data processing system of FIG. 2 with dual-rail power supply noise mixing according to some embodiments. GDDR PHY-DRAM link 800 includes a host processor 810 and a DRAM 820 interconnected by transmission media 830. Host processor 810 includes terminals 811 and 812, in which terminal 811 is connected to VDDQ_HOST through a resistor 813 having a first terminal connected to a VDDQ_HOST conductor, and a second terminal connected to terminal 811. Likewise, terminal 812 is connected to a ground power supply terminal labelled "VSSQ_HOST" through a resistor 814 having a first terminal connected to terminal 812, and a second terminal connected to the VSSQ_HOST conductor. Each of resistors 813 and 814 is a relatively low-valued resistor, in this example 20 ohms (Ω), but in other embodiments other resistance values can be used.

Similarly, DRAM 820 includes terminals 821 and 822, in which terminal 821 is connected to VDDQ_DRAM through a resistor 823 having a first terminal connected to a VDDQ_DRAM conductor, and a second terminal connected to terminal 821. Likewise, terminal 822 is connected to a ground terminal labelled "VSSQ_DRAM" through a resistor 824 having a first terminal connected to terminal 822, and a second terminal connected to the VSSQ_DRAM conductor. Each of resistors 823 and 824 is a relatively low-valued resistor, again in this example 20Ω.

DRAM 820 has a utilization circuit in the form of a receiver circuit 825. Receiver circuit 825 includes a variable capacitor 826, a variable capacitor 827, a comparator 828, and a resistor 829. Variable capacitor 826 has a first terminal connected to terminal 821, a second terminal, and a tuning control terminal. Variable capacitor 827 has a first terminal connected to terminal 822, a second terminal connected to the second terminal of variable capacitor 827, and a tuning control terminal. Comparator 828 has a positive input terminal connected to a data input/output terminal, designated "DQ_PAD", a negative input terminal connected to the second terminals of variable capacitors 826 and 827, and an output terminal for providing a corresponding data signal. Resistor 829 has a first terminal connected to the second terminals of variable capacitors 826 and 827 and the negative terminal of comparator 828, and a second terminal for receiving a voltage labelled "VREFD". Terminals 821 and 822 are connected to other receiver circuits for other signals making up the signal group.

Transmission media 830 include transmission lines 831 and 832. Transmission line 831 has a first end connected to terminal 811, and a second end connected to terminal 821. Transmission line 832 has a first end connected to terminal 812, and a second end connected to terminal 822.

GDDR PHY-DRAM link 800 mixes power supply noise from both host processor 810 and DRAM 820 to form VDDQ_MIX, and ground noise from both the host processor 810 and DRAM 820 to form a mixed ground voltage labelled "VSS_MIX". It does so by connecting the power supplies using low-valued resistors, and in this example capacitively coupling VDDQ_MIX and VSS_MIX to a reference node and DC biasing the reference node to a desired level. In this way, the ratio of compensation between the power supply and ground noise can be adjusted by changing the capacitance ratio of variable capacitor 826 to variable capacitor 827 using tuning controls. While GDDR PHY-DRAM link 800 uses capacitive coupling, other embodiments that will be explained further below use DC coupling. Moreover, while resistors 823 and 824 have a resistance of 20Ω, other resistances can be used in other embodiments.

Comparator 828 can support a variety of different signaling levels. For example, for NRZ signaling, VREFD would be approximately one-half of the nominal power supply voltage level. For PAM-3 or PAM-4 signaling, comparator 828 could distinguish one symbol and VREFD would be set to a level that slices the input signal at an appropriate level to distinguish the symbol. By capacitively coupling the VDD_MIX and VSS_MIX values to the reference voltage input, only the high-frequency noise components are passed through. Moreover, the values of variable capacitors 826 and 827 can be selected to vary the ratio of noise compensation between VDDQ and VSS noise.

Figure 9:
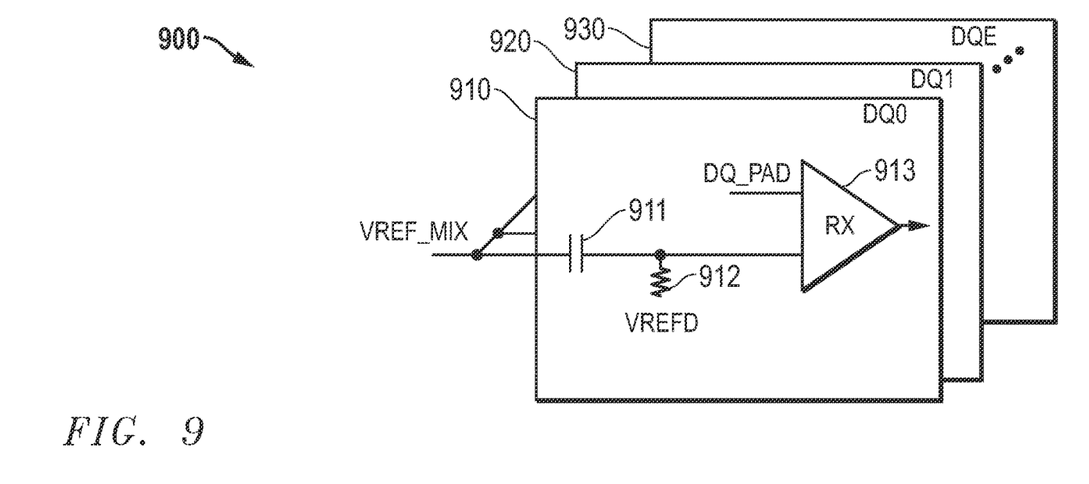
FIG. 9 illustrates in partial block diagram and partial schematic form a set of receiver circuits that use AC coupled mixed power supply noise with DC biasing according to some embodiments.

FIG. 9 illustrates in partial block diagram and partial schematic form a set of receiver circuits 900 that use AC coupled mixed power supply noise with DC biasing according to some embodiments. Receiver circuits 900 are suitable for use in either GPU 210 or GDDR memory 240 of data processing system 200 of FIG. 2. Receiver circuits 900 include receivers for data input/output signals DQ0-DQ7, a data mask signal DQM, and a data error correcting code signal DQE. FIG. 9 shows exemplary receiver circuits 910, 920, and 930 conducting signals DQ0, DQ1, and DQE, respectively. VREF_MIX is obtained using any of the methods described above, and is routed to each receiver circuit and the noise component in VREF_MIX is AC coupled through a corresponding capacitor. For example, receiver circuit 910 includes a capacitor 911, a resistor 912, and a comparator 913. Capacitor 911 has a first terminal for receiving VREF_MIX, and a second terminal. Resistor 912 has a first terminal for receiving VREFD, and a second terminal connected to the second terminal of capacitor 911. Comparator 913 has a positive input terminal connected to the integrated circuit terminal for DQ0 labelled "DQ_PAD", a negative input terminal connected to the second terminal of capacitor 911 and the second terminal of resistor 912, and an output terminal for providing the received DQ0 signal. Comparator 913 is useful for NRZ signaling as well as PAM-3 or PAM-4 signaling.

Figure 10:
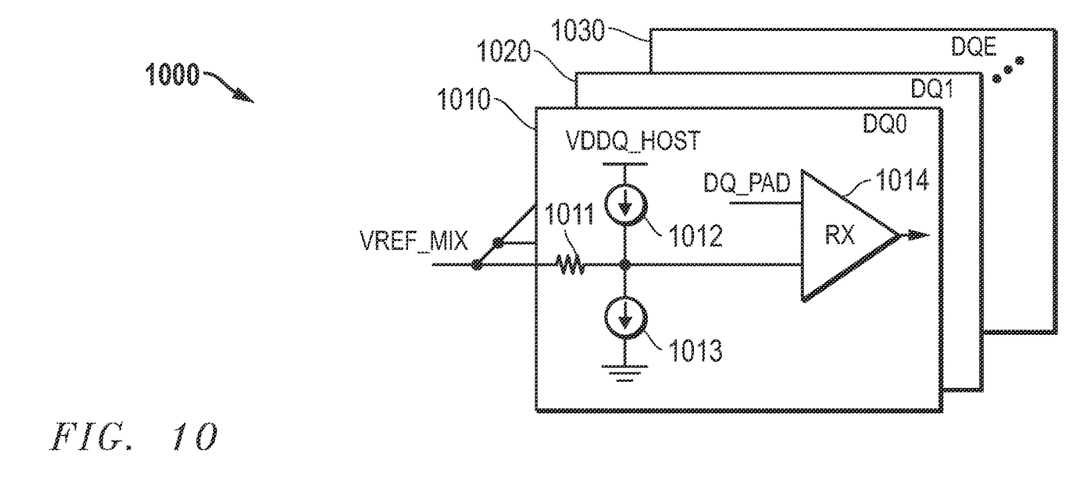
FIG. 10 illustrates in partial block diagram and partial schematic form a set of receiver circuits that use DC coupled mixed power supply noise with DC biasing according to some embodiments.

FIG. 10 illustrates in partial block diagram and partial schematic form a set of receiver circuits 1000 that use DC coupled mixed power supply noise with DC biasing according to some embodiments. Receiver circuits 1000 are suitable for use in either GPU 210 or GDDR memory 240 of data processing system 200 of FIG. 2. Receiver circuits 1000 include receivers for data input/output signals DQ0-DQ7, a data mask signal DQM, and a data error correcting code signal DQE. FIG. 10 shows exemplary receiver circuits 1010, 1020, and 1030 conducting signals DQ0, DQ1, and DQE, respectively. VREF_MIX is routed to each receiver circuit and the noise component in VREF_MIX is DC coupled through a corresponding resistor. For example, receiver circuit 1010 includes a resistor 1011, a current source 1012, a current source 1013, and a comparator 1014. Resistor 1011 has a first terminal for receiving VREF_MIX, and a second terminal. Current source 1012 has a first terminal for receiving VDDQ_HOST (or VDDQ_DRAM, as the case may be), and a second terminal connected to the second terminal of resistor 1011. Current source 1013 has a first terminal connected to the second terminal of resistor 1011 and current source 1012, and a second terminal connected to ground. Comparator 1014 has a positive input terminal connected to the integrated circuit terminal for DQ0, a negative input terminal connected to the second terminal of resistor 1011 and the second terminal of current source 1012, and an output terminal for providing the received DQ0 signal. Comparator 1014 is useful for NRZ signaling as well as PAM-3 or PAM-4 signaling based on the DC bias point set by current sources 1012 and 1013.

Figure 11:
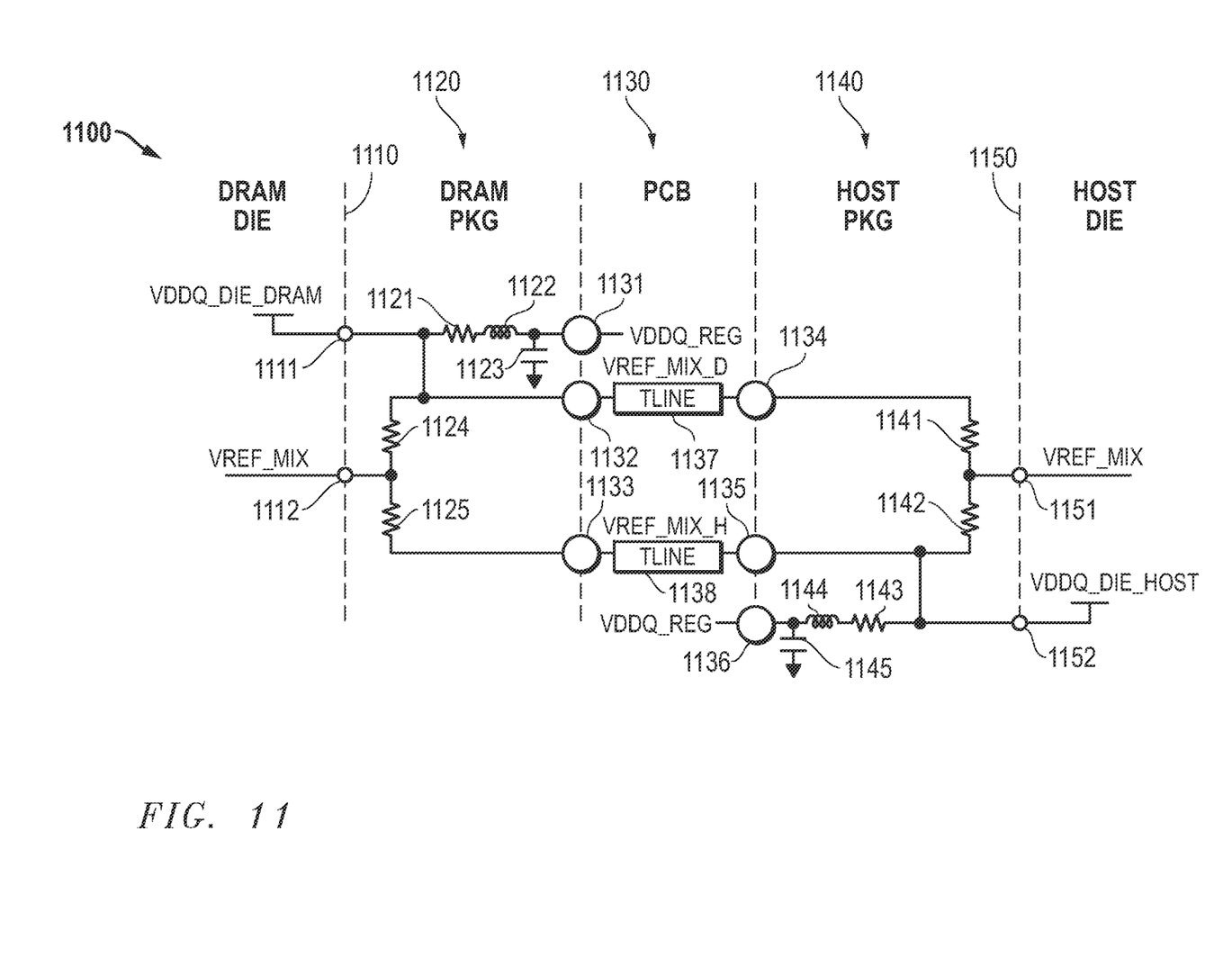
FIG. 11 illustrates in partial block diagram and partial schematic form a GDDR PHY-DRAM link useful in the data processing system of FIG. 2 with power supply noise mixing in the package according to some embodiments.

FIG. 11 illustrates in partial block diagram and partial schematic form a GDDR PHY-DRAM link 1100 useful in data processing system 200 of FIG. 2 with power supply noise mixing in the package according to some embodiments. GDDR PHY-DRAM link 1100 includes generally a DRAM die 1110, a DRAM package 1120, a printed circuit board (PCB) 1130, a host package 1140, and a host die 1150.

DRAM die 1110 includes die terminals 1111 and 1112 including a first die terminal 1111 connected to a power supply voltage labelled "VDDQ_DIE_DRAM", and second die terminal 1112 for providing the VREF_MIX_D signal. Die terminals 1111 and 1112 are shown as small circles to represent relatively small die bonding pads.

DRAM package 1120 includes a resistor 1121, an inductor 1122, a capacitor 1123, a resistor 1124, and a resistor 1125. Resistor 1121 has a first terminal connected to die terminal 1111, and a second terminal. Inductor 1122 has a first terminal connected to the second terminal of resistor 1121 and a second terminal. Capacitor 1123 has a first terminal connected to the second terminal of inductor 1122, and a second terminal connected to ground. Resistor 1124 has a first terminal connected to die terminal 1111, and a second terminal connected to die terminal 1112. Resistor 1125 has a first terminal connected to the second terminal of resistor 1124, and a second terminal.

PCB 1130 includes PCB terminals 1131-1136 and transmission lines 1137 and 1138. PCB terminals 1131-1136 are relatively large terminals compared to smaller the die bonding pads and are shown in FIG. 11 as large circles. PCB terminals 1131 and 1136 receive a voltage labelled "VDD_REG" generated on or received by PCB 1130 (not shown in FIG. 11). PCB terminal 1131 is connected to the second terminal of inductor 1122 and the first terminal of capacitor 1123 on DRAM package 1120. PCB terminal 1132 is connected to the first terminal of resistor 1124 on DRAM package 1120. PCB terminal 1133 is connected to the second terminal of resistor 1125 on DRAM package 1120. Transmission line 1137 connects PCB terminals 1132 and 1134. Transmission line 1138 connects PCB terminals 1133 and 1135.

Host package 1140 includes resistors 1141-1143, an inductor 1144, and a capacitor 111145. Resistor 1141 has a first terminal connected to PCB terminal 1134, and a second terminal. Resistor 1142 has a first terminal connected to the second terminal of resistor 1141, and a second terminal connected to PCB terminal 1135. Resistor 1143 has a first terminal connected to the second terminal of resistor 1142 and PCB terminal 1135, and a second terminal. Inductor 1144 has a first terminal connected to the second terminal of resistor 1143, and a second terminal connected to PCB terminal 1136. Capacitor 1145 has a first terminal connected to the second terminal of inductor 1144 and PCB terminal 1136, and a second terminal connected to ground.

Host die 1150 includes die terminals 1151 and 1152. Die terminal 1151 receives VREF_MIX_H and is connected to the second terminal of resistor 1141 and to the first terminal of resistor 1142. Die terminal 1152 receives a voltage labelled "VDDQ_DIE_HOST" and is connected to the second terminal of resistor 1142, PCB terminal 1135, and the first terminal of resistor 1143.

GDDR PHY-DRAM link 1100 implements in-package VREF mixing. In-package VREF mixing eliminates transmit logic overhead for on-die termination on both the DRAM die 1110 and host die 1150. It also reduces VREF mixing sensitivity to on-die high frequency localized noise. Moreover, it enables the use of a single differential pair of VREF mixing lines per DRAM package, avoiding the need for VREF mixing per channel. When implementing in-package VREF mixing, the VREF_MIX_D voltage should be connected as close to DRAM die bumps as possible to capture the full package impedance as seen by the DRAM die. The same connection requirement applies to VREF_MIX_H with respect to the host package connection.

GDDR PHY-DRAM link 1100 used in-package resistors between VREF_MIX_D and VREF_MIX_H to achieve desired mixing. Note that it is possible to generate multiple VREF_MIX signals locally in the package to provide different mixing ratios using with common die. While FIG. 11 only shows a single VREF mix ratio, multiple ratios can be generated using different resister combinations or tap points from the resistor dividers, in which one resistor divider is formed by resistors 1124 and 1125 and another resistor divider is formed by resistors 1141 and 1142.

Figure 12:
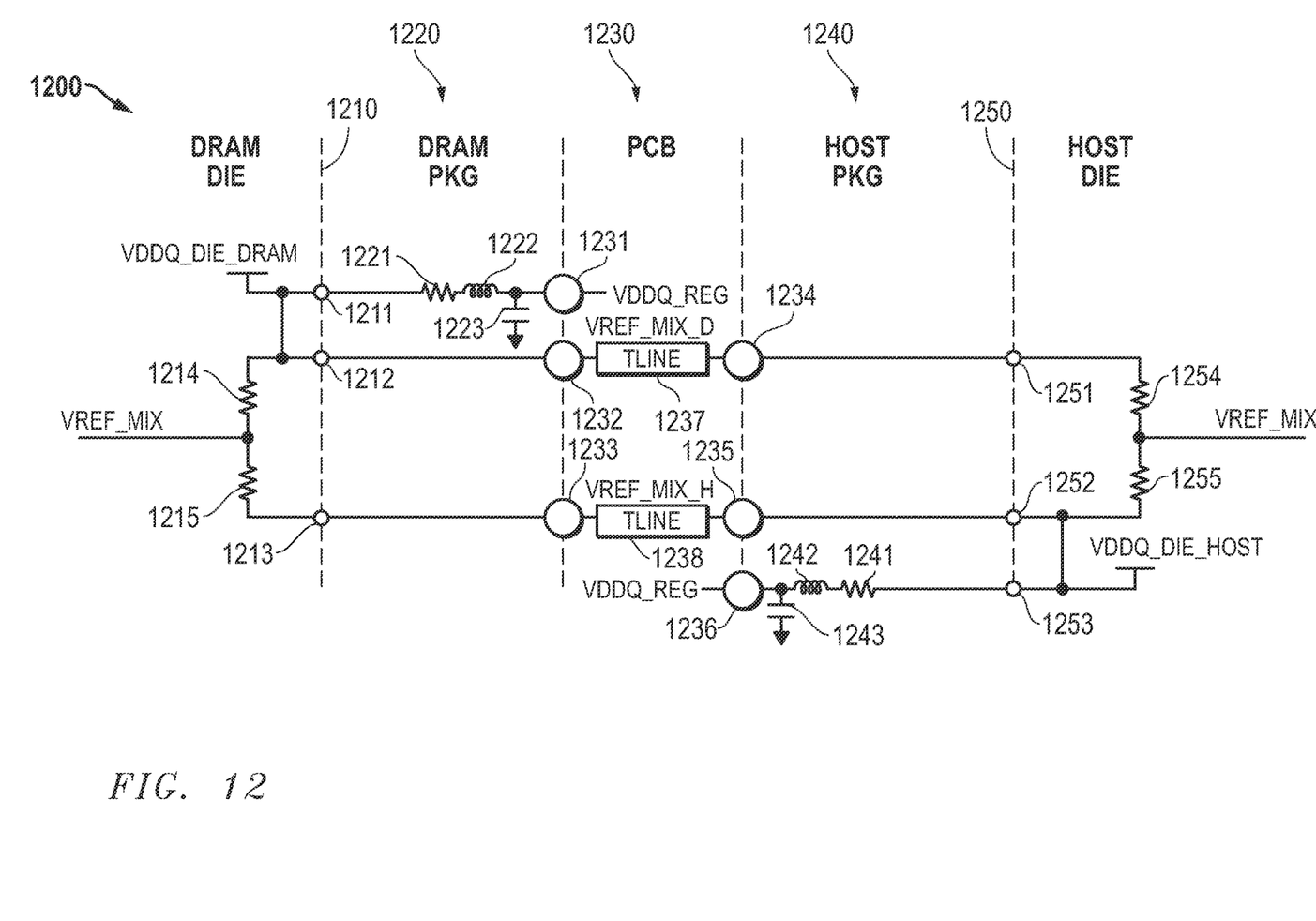
FIG. 12 illustrates in partial block diagram and partial schematic form another GDDR PHY-DRAM link useful in the data processing system of FIG. 2 with power supply noise mixing in the package according to some embodiments.

FIG. 12 illustrates in partial block diagram and partial schematic form a GDDR PHY-DRAM link 1200 useful in data processing system 200 of FIG. 2 with power supply noise mixing in the package according to some embodiments. GDDR PHY-DRAM link 1200 includes generally portions of a DRAM die 1210, a DRAM package 1220, a printed circuit board (PCB) 1230, a host package 1240, and a host die 1250.

DRAM die 1210 includes die terminals 1211-1213 and resistors 1214 and 1215. Die terminals 1211 and 1212 are connected to VDDQ_DIE_DRAM. Resistor 1214 has a first terminal connected to die terminals 1211 and 1212, and a second terminal for providing VREF_MIX_D. Resistor 1215 has a first terminal connected to the second terminal of resistor 1214, and a second terminal connected to die terminal 1213. Die terminals 1211-1213 are again shown as small circles to represent relatively small die bonding pads.

DRAM package 1220 includes a resistor 1221, an inductor 1222, and a capacitor 1223. Resistor 1221 has a first terminal connected to die terminal 1211, and a second terminal. Inductor 1222 has a first terminal connected to the second terminal of resistor 1221, and a second terminal. Capacitor 1223 has a first terminal connected to the second terminal of inductor 1222, and a second terminal connected to ground.

PCB 1230 includes PCB terminals 1231-1236 and transmission lines 1237 and 1238. PCB terminals 1131-1136 are relatively large terminals compared to smaller the die bonding pads and are shown in FIG. 12 as large circles. PCB terminals 1231 and 1236 receive a voltage labelled "VDD_REG" generated on or received by PCB 1230 (not shown in FIG. 12). PCB terminal 1231 is connected to the second terminal of inductor 1222 and the first terminal of capacitor 1223 on DRAM package 1220. PCB terminal 1232 is connected to die terminal 1212 on DRAM die 1210. PCB terminal 1233 is connected to die terminal 1213 on DRAM die 1210. Transmission line 1237 connects PCB terminals 1232 and 1234. Transmission line 1238 connects PCB terminals 1233 and 1235.

Host package 1240 includes a resistor 1241, an inductor 1242, and a capacitor 1243. Resistor 1241 has first and second terminals. Inductor 1242 has a first terminal connected to the second terminal of resistor 1241, and a second terminal connected to PCB terminal 1236. Capacitor 1243 has a first terminal connected to the second terminal of inductor 1242 and PCB terminal 1236, and a second terminal connected to ground.

Host die 1250 includes die terminals 1251-1253 and resistors 1254 and 1255. Die terminal 1251 is connected to PCB terminal 1234 through host package 1240. Die terminal 1252 is connected to PCB terminal 1235 on PCB 1230 through host package 1240. Die terminal 1253 receives voltage VDDQ_DIE_HOST and is connected to the first terminal of resistor 1241. Resistor 1254 has a first terminal connected to die terminal 1251, and a second terminal for providing VREF_MIX_H. Resistor 1255 has a first terminal connected to the second terminal of resistor 1254, and a second terminal connected to die terminals 1252 and 1253.

GDDR PHY-DRAM link 1200 implements in-die VREF mixing. In this example, the mixing ratios can be set by blowing selected fuses at the factory based on system characterization, or by using model specific registers or programmable mode registers during operation.

An integrated circuit, multi-chip module, or assembly or portions thereof described herein can be embodied one or more integrated circuits, any of which may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the VREF mixing function can be used during only certain cycles. Various embodiments use resistors that can set the mixing proportions for power supply and ground (VSS) portions. Both AC and DC coupling of the mixed noise values are possible in various embodiments. The mixing can be performed on-die, on-package, or various combinations of the two. Moreover, noise mixing can be performed using various signaling types, including conventional binary (NRZ) signaling, or signaling using more than two levels per symbol, such as PAM-3 signaling or PAM-4 signaling. The mixing can include both power and ground mixing, or noise mixing from only a single supply. Also, this technique is well-suited for use on GDDR memories due to their high speed and bandwidth requirements, but could be used in other types of memory including non-graphics DDR memory, high-bandwidth memory (HBM), and the like.

Accordingly, it is intended by the appended claims to cover all modifications of the disclosed embodiments that fall within the scope of the disclosed embodiments.

What is claimed is:

1. A data transmission system, comprising a first integrated circuit, the first integrated circuit comprising:
a first mixing terminal directly connected to a first power supply voltage terminal at a point internal to the first integrated circuit;
a first return terminal;
a first resistor having a first terminal directly connected to said first mixing terminal, and a second terminal for providing a first mixed voltage; and
a second resistor having a first terminal coupled to said second terminal of said first resistor, and a second terminal directly connected to said first return terminal,
wherein said first and second resistors mix noise components from a first power supply voltage on said first power supply voltage terminal and noise components from a second power supply voltage on said first return terminal.

2. The data transmission system of claim 1, wherein the first integrated circuit comprises circuitry that operates according to said first mixed voltage.

3. The data transmission system of claim 1, further comprising a second integrated circuit, wherein the second integrated circuit comprises:
a second mixing terminal coupled to said first return terminal and to a second power supply voltage terminal internal to said second integrated circuit;
a second return terminal coupled to said first mixing terminal;
a third resistor having a first terminal coupled to said second mixing terminal, and a second terminal for providing a second mixed voltage; and
a fourth resistor having a first terminal coupled to said second terminal of said third resistor, and a second terminal coupled to said second return terminal.

4. The data transmission system of claim 3, wherein the first integrated circuit comprises first circuitry that operates according to said first mixed voltage and the second integrated circuit comprises second circuitry that operates according to said first mixed voltage.

5. The data transmission system of claim 1, further comprising:
a reference voltage generation circuit having an output for providing a reference voltage in response to said first mixed voltage.

6. The data transmission system of claim 5, wherein said reference voltage generation circuit provides said reference voltage by biasing a reference voltage signal line to a DC level and AC-coupling said first mixing voltage onto said reference voltage signal line.

7. The data transmission system of claim 5, wherein said reference voltage generation circuit biases a reference voltage signal line to a DC level and AC-couples said first mixing voltage onto said reference voltage signal line.

8. The data transmission system of claim 5, further comprising:
a receiver circuit having a first input for receiving an input signal, a second input coupled to said output of said reference voltage generation circuit, and an output for providing a received signal.

9. The data transmission system of claim 1, wherein:
the first integrated circuit uses the first mixed voltage to receive at least one signal on an input terminal of the first integrated circuit.

10. A data transmission system comprising a first integrated circuit and a second integrated circuit, wherein the first integrated circuit comprises:
a first mixing terminal for receiving a voltage having a noise component of a second power supply voltage of the second integrated circuit;
a reference voltage generator receiving a first power supply voltage of the first integrated circuit and said voltage and providing a first reference voltage signal in response thereto; and
a receiver circuit having a first input for receiving an input signal, a second input for receiving said first reference voltage signal, and an output for providing a received signal,
wherein said reference voltage generator comprises:
a first selectable transmission element, having a first terminal coupled to said first mixing terminal, and a second terminal for providing a first mixing voltage, wherein the first integrated circuit uses said first mixing voltage to receive at least one external signal;
a first resistor having a first terminal coupled to a first power supply voltage terminal used in the first integrated circuit, and a second terminal coupled to said second terminal of said first selectable transmission element;
a second selectable transmission element, having a first terminal coupled to said second terminal of said first selectable transmission element, and a second terminal; and
a second resistor having a first terminal coupled to said second terminal of said second selectable transmission element, and a second terminal coupled to a second power supply voltage terminal.

11. The data transmission system of claim 10, wherein:
said first selectable transmission element is non-conductive in a first mode; and
said first selectable transmission element is conductive and said second selectable transmission element is non-conductive in a second mode.

12. The data transmission system of claim 11, wherein the first integrated circuit comprises:
a mode register for programmably selecting said first mode and said second mode.

13. The data transmission system of claim 11, wherein:
said first selectable transmission element and said second selectable transmission element are conductive and said second resistor has a first value in a third mode; and
said first selectable transmission element and said second selectable transmission element are conductive and said second resistor has a second value different from said first value in a fourth mode.

14. The data transmission system of claim 13, wherein the first integrated circuit comprises:
a mode register for programmably selecting one of said first mode, said second mode, said third mode, and said fourth mode.

15. The data transmission system of claim 10, wherein the second integrated circuit comprises:
a second mixing terminal coupled to said first mixing terminal;
a third selectable transmission element, having a first terminal coupled to said second mixing terminal, and a second terminal for providing a second mixing voltage, wherein the second integrated circuit uses the second mixing voltage to receive said at least one external signal;
a third resistor having a first terminal coupled to said second power supply voltage terminal used in the second integrated circuit, and a second terminal coupled to said second terminal of said first selectable transmission element;

a fourth selectable transmission element, having a first terminal coupled to said second terminal of said first selectable transmission element, and a second terminal; and a fourth resistor having a first terminal coupled to said second terminal of said fourth selectable transmission element, and a second terminal coupled to said second power supply voltage terminal.

* * * * *